(12) United States Patent
Ostergard et al.

(10) Patent No.: US 7,033,959 B2
(45) Date of Patent: Apr. 25, 2006

(54) METHOD FOR MANUFACTURING ORGANIC SEMICONDUCTOR SYSTEMS

(75) Inventors: Toni Ostergard, Turku (FI); Terho Kaikuranta, Piispanristi (FI)

(73) Assignee: Nokia Corporation, Espoo (FI)

( * ) Notice: Subject to any disclaimer, the term of this patent is extended or adjusted under 35 U.S.C. 154(b) by 34 days.

(21) Appl. No.: 10/159,809

(22) Filed: May 31, 2002

(65) Prior Publication Data

US 2003/0224621 A1    Dec. 4, 2003

(51) Int. Cl.
*H01L 21/469* (2006.01)
(52) U.S. Cl. .................. 438/780; 438/781; 438/778
(58) Field of Classification Search .............. 438/21, 438/22, 38, 149, 153, 154, 142
See application file for complete search history.

(56) References Cited

U.S. PATENT DOCUMENTS

| 5,641,997 A * | 6/1997 | Ohta et al. ............... 257/788 |
| 6,413,790 B1 * | 7/2002 | Duthaler et al. .......... 438/21 |
| 6,521,489 B1 * | 2/2003 | Duthaler et al. .......... 438/149 |

* cited by examiner

*Primary Examiner*—Dung A. Le
(74) *Attorney, Agent, or Firm*—Ware, Fressola, Van Der Sluys & Adolphson LLP

(57) ABSTRACT

A method and related apparatus for manufacturing organic semiconductor systems uses reel-to-reel processing to deposit organic semiconductor material at desired locations on the surface of a substrate to produce desired circuit functionality. The fabric substrate is further laminated for integration with an item such as a garment or other fabric or material and becomes a part thereof imparting intelligence to the item.

20 Claims, 4 Drawing Sheets

METHOD FOR MANUFACTURING ORGANIC SEMICONDUCTOR SYSTEMS

TECHNICAL FIELD

The present invention relates generally to organic semiconductor devices and deals more particularly with a method and apparatus for manufacturing organic semiconductor devices and systems. More specifically, the invention relates to the mass manufacturing of organic semiconductor devices and circuits in a reel-to-reel manufacturing process. The invention further relates to an organic semiconductor device fabric system manufactured in the reel-to-reel manufacturing process for subsequent use in and integration with a product, such as clothing, to impart a desired operational functionality to the product.

BACKGROUND OF THE INVENTION

The use of organic semiconductor devices and organic circuits has become more widespread in an attempt to provide very low cost circuits to meet various applications and systems. The organic semiconductor technologies are expected to provide novel features, substrates and manufacturing technologies not currently possible with traditional, inorganic semiconductors. The organic semiconductor devices themselves are carbon-based materials exhibiting semiconducting properties. The materials are chemically synthesized as polymers or as small molecules and the variations of different materials are literally infinite. The organic semiconductors and devices can be used for similar applications as inorganic semiconductors and devices, particularly in the field of electronics and opto-electronics. Although the applications may be similar, the "physics" or properties that organic and inorganic semiconductors exhibit are very much different. To illustrate, silicon (Si) is one type of an inorganic semiconductor that cannot, for example, in its present form, be used as an emitting material; that is, it cannot be used in light emitting diodes (LEDs). Additionally, the processing of organic semiconductors is very different from that of the inorganic semiconductors. The polymeric materials are usually solution processed, that is, for example, by spin casting or ink-jet printing and the deposition of the material is relatively straightforward on practically any type of substrate, whether it be rigid or flexible. In comparison, the small molecular compounds are usually deposited by vacuum processing techniques and may also be applied to basically any substrate, whether it be rigid or flexible. Although holding great promise as a technology, organic semiconductor devices and systems are currently limited to relatively low production quantities due to manufacturing difficulties and techniques. In addition, currently available organic semiconductor devices and systems are relatively higher in cost than their counterpart silicon devices, which are manufactured in high volume.

In order to expand the number and types of applications using organic semiconductor devices and organic circuits, providing such applications must become more cost effective and the organic semiconductor devices, organic circuits and systems must be produced in higher volumes to achieve economies of scale and to provide sufficient quantities for use in widespread applications.

There is also a demand to provide greater integration of devices and features in complex integrated systems. One such area is that of "smart clothing," in which the organic semiconductor devices and circuits would be carried by or in the fabric of the clothing. The currently used technology in "smart clothing" is traditional and integrates devices such as heart rate monitors, motion and temperature sensors, humidity sensors, audio and optical devices, communication devices and the like to achieve a desired functionality. The use of traditional technology to implement such "smart clothing" is not entirely satisfactory due to the weight and cost of the systems, as well as the complexity of implementing such a system.

It is desirable, therefore, to overcome the problems, drawbacks and limitations in manufacturing organic semiconductor devices and organic circuits and systems by utilizing reel-to-reel processing techniques and apparatus to provide a simple means for mass manufacturing of organic semiconductor devices and organic circuits and systems on substrate material.

SUMMARY OF THE INVENTION

In accordance with the broader aspects of the invention, a method and related apparatus for mass manufacturing organic semiconductor devices, organic circuits and organic semiconductor-based systems overcomes, if not substantially eliminates, many of the problems associated with low-cost, high-volume production of such devices, circuits and systems.

In a first aspect of the invention, a method for manufacturing organic semiconductor-based systems is presented. The method comprises the steps of providing a quantity of substrate material having a width and a length and a receiving surface, providing means for applying organic material defining an organic semiconductor device onto the receiving surface of the substrate material, and moving the receiving surface relative to the applying means for depositing the organic material on the receiving surface in a pre-determined pattern as the receiving surface moves relative to the applying means.

Preferably, in one aspect, the step of providing applying means further includes providing at least one printing head for printing the organic material onto the receiving surface.

Preferably, in another aspect, the method also comprises providing an evaporation chamber for housing the quantity of substrate material, locating an evaporation mask in proximity to the receiving surface between the receiving surface and an evaporation source of organic semiconductor material, and vacuum depositing the organic semiconductor material on the receiving surface of the substrate material.

Preferably, the method includes providing means upstream of the applying means for feeding the substrate material to the applying means.

Preferably, the method includes providing means downstream of the applying means for collecting the substrate material passing the applying means.

Preferably, the step of providing the substrate material includes providing a roll of substrate material.

Preferably, the step of providing the substrate material includes providing a roll of fabric substrate material.

Preferably, the method includes the step of providing a protective layer on the receiving surface of the substrate material and applying the organic semiconductor material to the surface of the protective layer.

Preferably, the step of providing the protective layer further comprises pre-coating the receiving surface of the substrate material with the protective layer.

Preferably, the step of providing the protective layer further comprises applying the protective layer to the receiving surface of the substrate material prior to depositing the organic semiconductor material on the protective layer.

Preferably, the method includes providing an outer protective layer over the deposited organic semiconductor material.

Preferably, the method includes the step of laminating a fabric material to a first side of the organic semiconductor deposited substrate material.

Preferably, the method further includes laminating a fabric material to a second side of the organic semiconductor deposited substrate material.

Preferably, the method further includes laminating the fabric material to the organic semiconductor deposited side of the substrate material.

Preferably, the method includes laminating a fabric material to both sides of the organic semiconductor deposited substrate material.

Preferably, the method includes depositing the organic semiconductor material in at least one predetermined pattern to define a desired circuit.

Preferably, the method includes providing circuit contact access means.

Preferably, the method further includes providing at least one aperture in a fabric material covering the deposited organic semiconductor material through which aperture the organic semiconductor circuit is accessed.

Preferably, the method further includes providing contact means having one side coupled to the organic semiconductor circuit and a material deforming side opposite the one side for penetrating through a fabric material covering the deposited organic semiconductor material to provide the desired circuit contact access.

Preferably, the method includes providing a retaining cap means on the contact means to sandwich the fabric material between the retaining cap and one side of the substrate material.

Preferably, the method further includes sandwiching the fabric material between the retaining cap and the side of the substrate material carrying the organic semiconductor circuit.

Preferably, the method further includes providing conducting means for electrically coupling the at least one predetermined pattern defining the desired circuit and for carrying signals including voltage reference potential signals, electrical ground reference potential signals and mixed digital and analog signals.

Preferably, the method further includes providing a seam tape having at least one electrically conductive stripe on one side of the seam tape for electrically contacting one or more predetermined patterns defining the desired circuit to provide a desired system.

Preferably, the method further includes integrating the desired circuit into a garment or piece of clothing and adhering the seam tape to the surface of the garment and in electrical contact with the desired circuit to provide an electrical conductive path to and from the at least one desired circuit.

In a second aspect of the invention, apparatus for manufacturing organic semiconductor-based systems is presented. The apparatus includes a pay-out station for holding a supply of suitable substrate material; reservoir means for holding a supply of organic semiconductor material; an application station having depositing means coupled to the reservoir means; means for moving the substrate material past the application station; means for moving the depositing means and the substrate material at the application station to provide relative movement to one another along an X-Y coordinate plane; and means for controlling the depositing means to deposit and not deposit the organic semiconductor material at a desired location on the surface of the substrate as the substrate surface and depositing means move relative to one another along the X-Y coordinate plane.

Preferably, in one aspect, the depositing means further comprises an ink-jet printer head.

Preferably, in another aspect, the apparatus further includes a vacuum chamber, an evaporation mask and an evaporation source of organic semiconductor material for vacuum depositing the semiconductor material on the surface of the substrate material.

Preferably, the apparatus further includes means upstream of the application station for applying a protective layer on the substrate material.

Preferably, the apparatus further includes means downstream of the application station for applying a protective layer on the deposited organic semiconductor material.

Preferably, the apparatus further includes a lamination station downstream of the application station for laminating at least one side of the organic semiconductor deposited substrate material.

DESCRIPTION OF PREFERRED EMBODIMENTS

Figure 1:
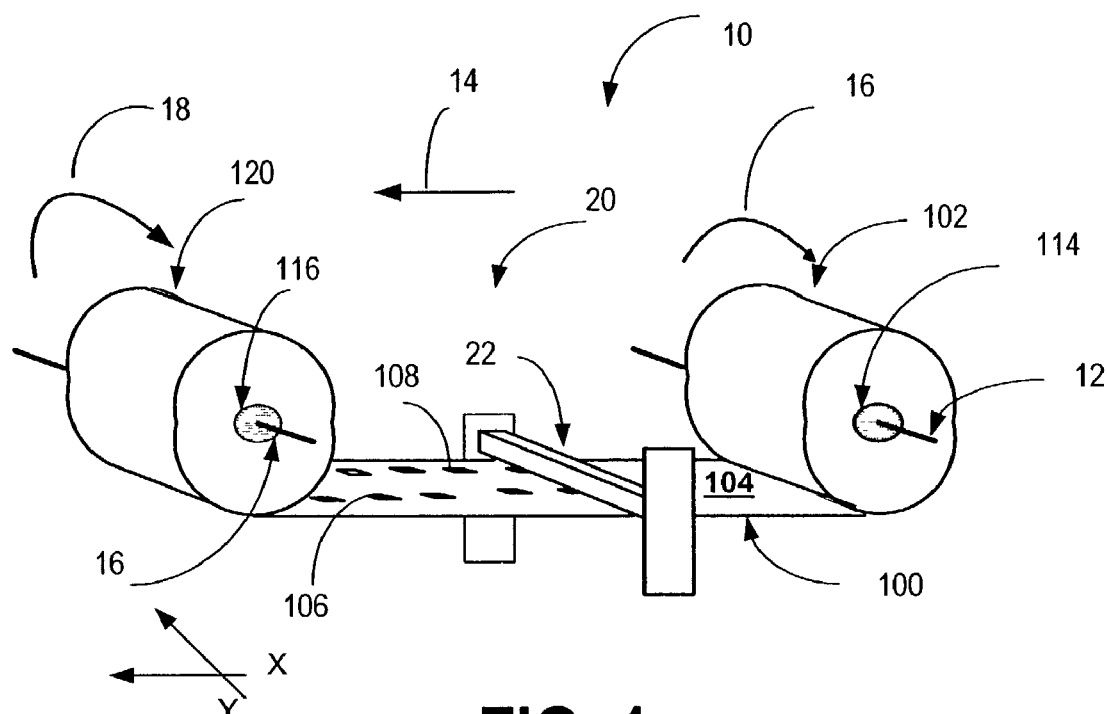
FIG. 1 is a schematic representation of apparatus embodying the present invention for applying organic semiconductor material onto the surface of a substrate passing an application station.

Turning now to the drawings, a schematic representation of apparatus for manufacturing an organic semiconductor device and organic circuit deposited flexible substrate is illustrated therein in accordance with one embodiment of the present invention and is generally designated 10. A suitable substrate material, generally designated 100, preferably flexible, is carried on a roll 102 which rotates in the direction of arrow 16 on a pay-out reel 114. The pay-out reel 114 rotates about an axis 12 in the illustrated embodiment. The substrate material 100 advances in a controlled manner in the direction of arrow 14 past an application station, generally designated 20, to receive the organic semiconductor material. The substrate material 100 may be of any suitable type having a surface 104 to receive the semiconductor material. Preferably, the substrate 100 is of a flexible material; however, a rigid or semi-rigid substrate may also be utilized with corresponding modifications to the substrate feeding mechanism.

Suitable applicators for depositing or not depositing organic semiconductor material, such as, for example, now known polymeric-, oligomeric- or molecular-based materials or suitable future-developed organic semiconductor materials on the surface 104 of the substrate 100 are carried in a spaced relationship with respect to the receiving surface 104. In FIG. 1, the application station 20 includes organic semiconductor material applicators (not shown in FIG. 1) carried along or held in a fixed orientation or with limited movement in a gantry 22. The applicators are arranged within the gantry 22 to provide relative movement between the surface 104 of the substrate 100 and the applicator in an X,Y coordinate direction. A suitable controller (not shown) regulates the rotation of the reels and provides controlled movement of the substrate and the applicators to deposit or not deposit the organic semiconductor material in a desired pattern, shown generally as 106, 108, to achieve the desired electrical functionality in a completed operational unit. The substrate 100 moves through the application station 20 and in the direction indicated by the arrow 14 and is collected on a take-up mechanism, which may be a take-up reel 62 rotating in the direction of arrow 18 about an axis 16 to form a collection roll 120 of the organic semiconductor deposited substrate. Other suitable collection means may be employed without departing from the invention in accordance with the type of substrate material present. The organic semiconductor material applicators may be of any suitable type, including ink-jet printing heads that are controllable to deposit or not deposit the organic semiconductor material as required. Additional methods for depositing the organic semiconductor material may also be utilized in accordance with the specific requirements, for example, an offset gravure or direct gravure may be used to transfer and apply the semiconductor material from a supply of semiconductor material to the substrate surface 104.

Figure 2:
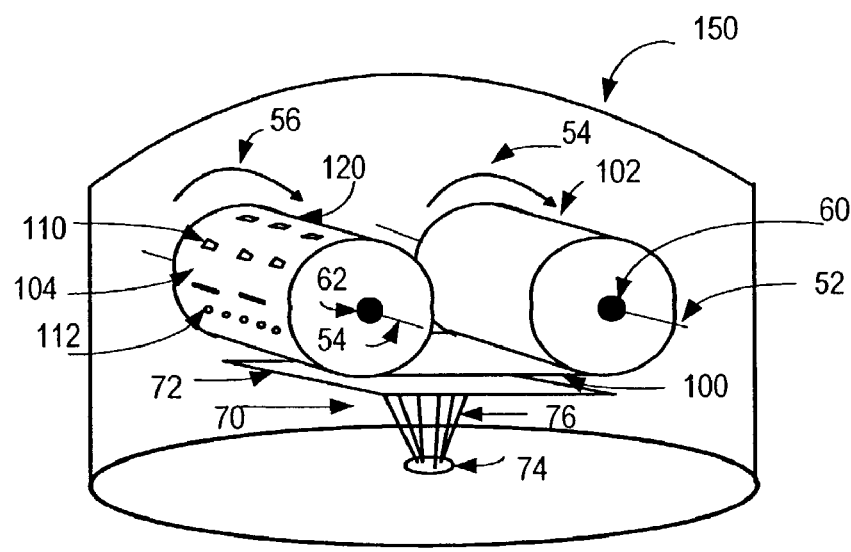
FIG. 2 is a schematic representation of apparatus embodying the present invention for vacuum deposition of organic semiconductor material onto the surface of a substrate passing an evaporation application station.

Turning now to FIG. 2, apparatus for carrying out vacuum deposition of a suitable organic semiconductor material, such as polymeric, oligomeric and/or molecular, or other now known or future-developed organic semiconductor material on the receiving surface of the substrate is illustrated therein and generally designated 50. In the apparatus 50, the substrate material 100 is carried on a supply roll 102 from a pay-out reel 60 that is arranged to rotate about an axis 52 in the direction 54. The substrate material 100 passes through an application station, generally designated 70, to a take-up reel 62 arranged to rotate about an axis 54 to form a collection roll 120. The supply roll 102, collection roll 120 and application station 70 are housed in a vacuum chamber or structure, generally designated 150. The application station 70 includes an evaporation mask 72 located and positioned a suitable distance from and relative to the receiving surface 104 of the substrate 100 and between the substrate surface 104 and a supply of organic semiconductor material, generally designated 74. The organic semiconductor material 76 is deposited on the receiving surface 104 of the substrate 100. The organic semiconductor material 76 is forced through a pattern aperture in the evaporation mask 72, which causes the desired pattern 110, 112 to be applied to the substrate surface 104 by allowing the organic semiconductor material 76 to pass through the pattern aperture in the mask 72 and be blocked by the surrounding surface portion of the mask. Vacuum deposition of materials and the use of an evaporation mask are well known to those skilled in the art of vacuum deposition using this technique. As is the case of the reel-to-reel manufacturing process and apparatus described above in connection with FIG. 1, the substrate material 100 moves in a controlled manner relative to the application station 70 to receive the organic semiconductor material prior to passing to the take-up reel 62 which rotates about the axis 54 in the direction 56 to form the collection roll 120.

The present invention contemplates the use of organic semiconductor devices which are based on semiconducting polymers, oligomers or molecules, various blends of the semiconducting polymers, oligomers or molecules and other suitable organic and inorganic materials now known or future-developed. Such devices contemplated are, for example, organic light emitting diode/displays (OLED), organic thin film transistors (OTFT) and circuits based on OTFTs, OLEDs, including organic image scanners and cameras. Conducting wires and connectors and resistors based on conducting polymers, for example, and doped semiconductors, are further devices contemplated in the present invention to be used in the reel-to-reel manufacturing process. Other devices such as gas sensors are primarily organic semiconductors, although other organic materials may be used with the invention. Additionally, organic materials other than organic semiconducting materials are also contemplated and suitable for use in the reel-to-reel manufacturing process and may be used, for example, in temperature sensors, humidity sensors and the like.

Figure 3:
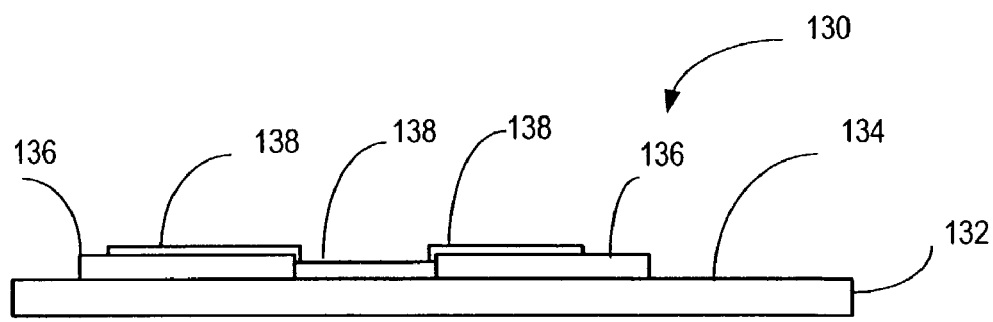
FIG. 3 is a schematic cross-sectional view of a substrate pre-coated with a protective layer upon which the organic semiconductor material is deposited.
Figure 4:
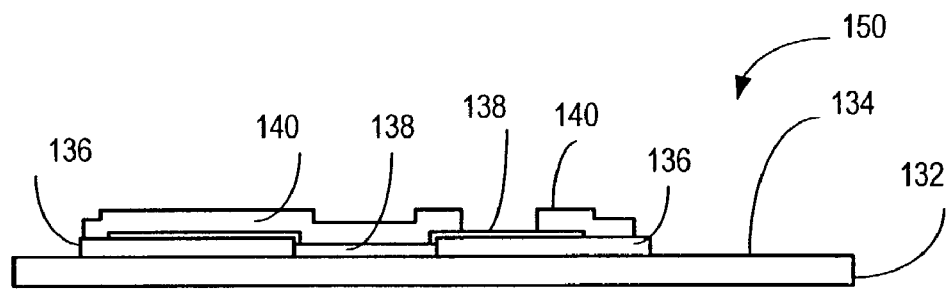
FIG. 4 is a schematic cross-sectional view of a substrate wherein the deposited organic semiconductor material is covered with a protective layer.

Turning now to FIG. 3, a schematic cross-sectional view of a substrate assembly embodying the present invention is illustrated therein and generally designated 130. The substrate assembly 130 includes a suitable substrate 132, preferably fabric or plastic foil, having its receiving surface 134 pre-coated with a protective layer, generally designated 136. The substrate 132 may be pre-coated with the protecting layer 136 prior to being fed to the organic semiconductor material application station, where the organic semiconductor material(s) and/or conducting materials shown generally as 138 in FIG. 3 are applied to the substrate. Alternately, the substrate 132 can be pre-coated with the protective layer 136 immediately preceding the application or deposition of the organic semiconductor material 138 on the receiving surface 134. In such an application, the substrate is preferably pre-coated at a protective layer application station upstream of the organic semiconductor material application station using a suitable protective layer material to allow drying or curing, if required, prior to the application of the organic semiconductor material(s) and/or conducting materials. An alternate embodiment of the substrate assembly is illustrated in FIG. 4, and generally designated 150. In the embodiment of FIG. 4, the organic semiconductor material(s) and/or conducting materials 138 are deposited on the protective layer 136 on the receiving surface 134 of the substrate 132 and subsequent to the deposition of the organic semiconductor material(s) and/or conducting materials 138, a protective layer 140 is deposited on the devices and/or systems defined by the organic material(s) 138. The outer protective layer 140 provides protection to the deposited organic semiconductor devices and/or systems.

Figure 5:
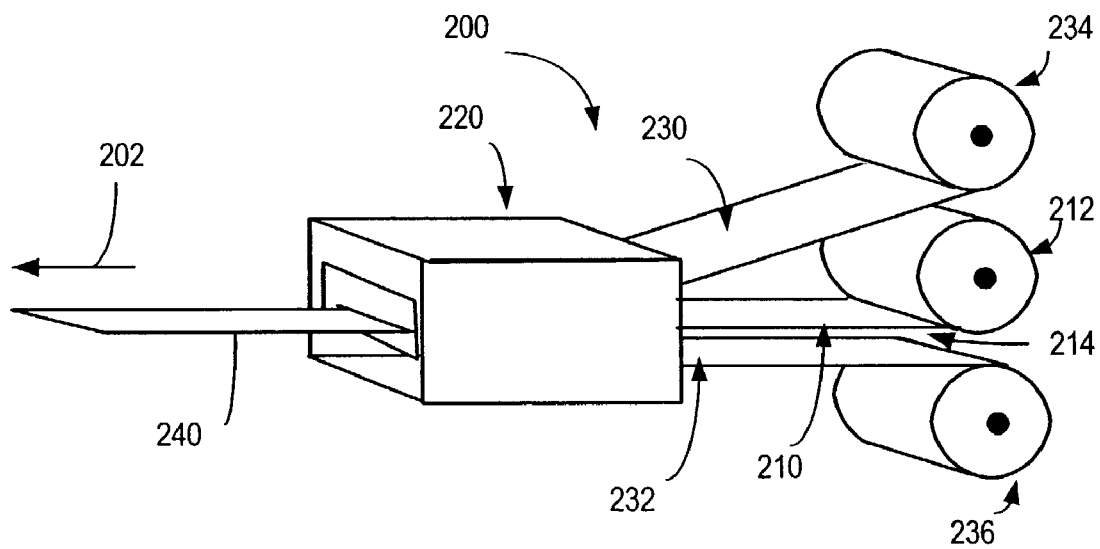
FIG. 5 is a schematic representation of apparatus embodying the present invention showing an organic semiconductor deposited fabric substrate passing through a laminating station for lamination between two fabric sheets.

Turning now to FIG. 5, a schematic representation of an alternate embodiment of the apparatus of the present invention is illustrated therein and generally designated 200. An organic semiconductor deposited fabric or plastic foil substrate 210, such as described above for example, is carried on a supply roll 212. The substrate 210 passes through a laminating station 220 for lamination with at least one other fabric or plastic substrate layer. In the apparatus 200 of FIG. 5, the organic semiconductor deposited fabric or plastic substrate 210, also referred to as the "active fabric," is provided from the supply roll 212 and is fed into the lamination station 220 where it is laminated between two fabric layers 230 and 232, respectively. The term "fabric" as used herein is contemplated in its broadest sense to include materials of any type now known or future-developed upon which the organic semiconductor material(s) and/or conducting materials are deposited or otherwise carried. One laminating fabric layer 230 is provided on the supply roll 234 and covers one surface 212 of the active fabric 210 and the opposite surface 214 is covered with the laminating fabric 232 supplied from the roll 236. The active fabric 210 and the two oppositely disposed laminating fabrics 230, 232 are fed through the lamination station 220 in the direction of arrow 202 to produce a final laminated fabric 240 in accordance with the present invention. Alternately, the active fabric 210 can be laminated with a single fabric layer, preferably with the organic semiconductor devices and circuits sandwiched between the substrate surface 212 and the laminating fabric layer 230.

The invention contemplates that the active fabric provides various types of circuits, for example, processors, serial-to-parallel and parallel-to-serial converters, analog-to-digital and digital-to-analog converters, buffers, memories, logic circuitry and others based upon organic thin film transistors (OTFT) implementation. It is contemplated that the active fabric be laminated in one embodiment as discussed in further detail below, to form a fabric of a garment. Additional functionality such as temperature and humidity sensors discussed above may be components of the active fabric and provide sensed values within and without the garment with which it is utilized. Further implementations of the active fabric include the addition of gas sensors for detecting the presence of various gases and volatile organic compounds. Further implementations contemplated for integration with the active fabric are organic light detectors, image scanners, cameras, organic displays and organic light emitting diodes (OLED) arranged to display information to the user as well as providing visual illumination signals to the user and viewers, including the possibility of using traditional electroluminescent illumination.

The organic circuits, for example as discussed above, integrated into the active fabric can process, "route" and combine the data information from the various different functional devices including sensors, input devices, and the like and based on the specific application can provide an indication of a needed action or an alerting signal or some other appropriate activity in accordance with the specific application. It is also contemplated that the components of the active fabric may interface with external devices which may also be attached to the garment. Such attached devices could be mobile communication devices, which would provide various wireless services to the user. The required power is coupled to the active fabric within the garment from external devices or a separate power source which itself could be external or integrated into the garment. It can be seen that various advanced, complex integrated systems can be developed and may include the requirement of memory to carry out the various functions of the application and which functions may be stored in a non-volatile memory which is also made part of the garment.

One example of an advanced, complex integrated system integrated into a garment is safety clothing, for example, a hazardous material safety garment. The sensors, indicators and various communication capabilities are integrated into the active fabric which is integral with the safety clothing and provides information regarding the user's own conditions, such as temperature, the user's surroundings, the presence of various gases or other hazards, information relative to the surroundings which are communicated to the user via the wireless external device which is arranged to receive such information from, for example, a central command position. Various alerting signals such as flashing lights, emergency notification to the central command station in response to the detection by the various sensors would automatically be transmitted to alert the personnel at the central station of the condition to allow the personnel to take appropriate action.

Figure 6:
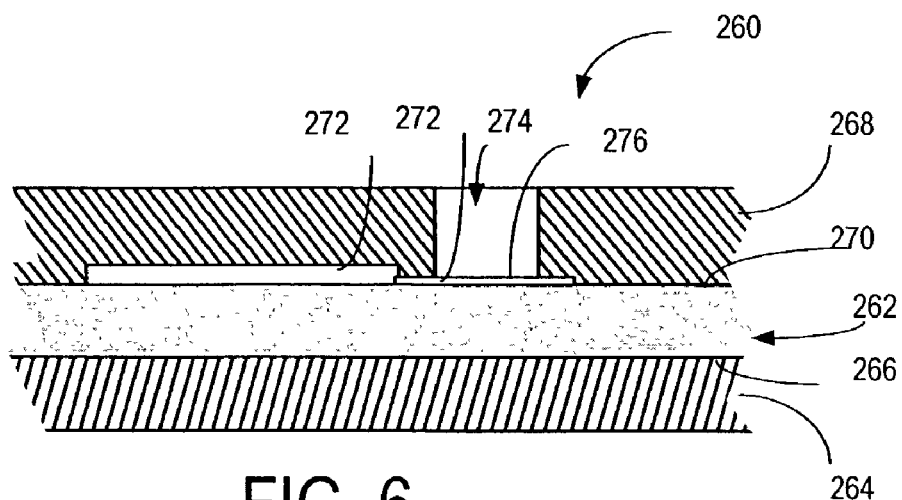
FIG. 6 is a schematic cross-sectional view of a laminated organic semiconductor deposited substrate having an aperture or opening through the laminating fabric to expose a portion of the organic semiconductor material and/or a printed/evaporated conducting electrode for contact.

Turning now to FIG. 6, a schematic cross-sectional fragmentary view of a laminated organic semiconductor deposited substrate, such as described above for example, is illustrated therein and generally designated 260. The substrate 260 includes an active fabric layer 262, a first fabric layer 264 laminated to the one side 266 of the active fabric layer 262 and a second fabric layer 268 laminated to the opposite side 270 of the active fabric layer 262 sandwiching the organic semiconductor devices/system 272 deposited on the surface side 270. An opening or aperture 274 is provided in the laminating fabric layer 268 and is located to provide access and a contact surface 276 with the organic semiconductor device or its electrode 272 deposited on the receiving surface 270 of the active fabric 262. The apertures or openings in the laminating fabric can be pre-patterned or may be precisely made after the lamination process. In such an event, the lamination would have indexing or registration markings to indicate the location of the organic semiconductor devices on the active fabric with which contact is desired. Obviously, any method and apparatus suitable for providing the necessary opening or aperture in the laminating fabric to provide access and contact with the organic semiconducting material is suitable to carry out the present invention.

The laminating fabric layer can be of a waterproof and/or airproof material to protect the deposited organic semiconductor devices against the humidity and exposure to oxygen if necessary. Likewise, the fabric may be breathable, for example similar to a GOR-TEX® fabric to allow air and humidity to come into contact with the devices deposited on the substrate, for example, a gas detector. The pre-coating of the fabric may be done with a suitable rigid or flexible material depending upon the characteristics desired. For example, if it is required to provide additional protection from the environment or mechanical stress, the fabric can be coated or pre-coated with a suitable material to provide the desired characteristics and properties. It is also contemplated that the laminating fabric layer 264 and the laminating fabric layer 268 may also function as the outer or inner fabric layer of the garment or clothing and therefore the substrate with the deposited organic semiconductor devices and circuits are thus made part of the garment or article of clothing such as described below in connection with FIGS. 8, 9 and 10.

Figure 7:
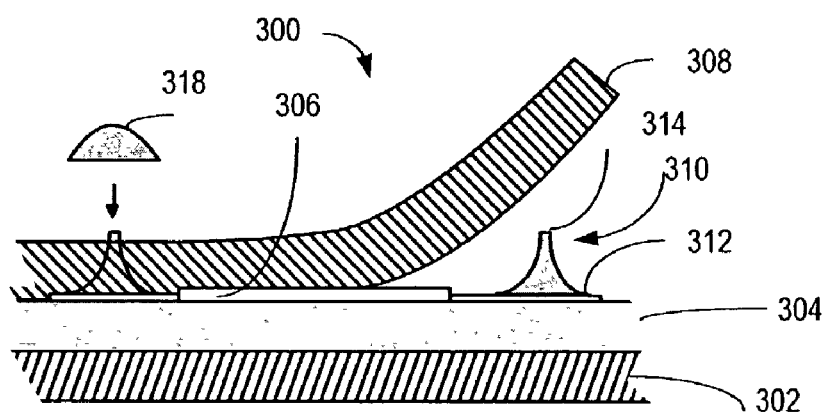
FIG. 7 is a schematic cross-sectional view of a laminated organic semiconductor deposited substrate showing a fabric displacement contact penetrating the laminating fabric to provide contact with the organic semiconductor material.

Turning now to FIG. 7, an alternate arrangement to provide contact with the organic semiconductor device and/or organic circuit defining the desired system is illustrated therein and generally designated 300. The arrangement shown in FIG. 7 is similar to that shown in FIG. 6 and includes a first fabric laminating layer 302, an active fabric layer 304 upon which organic semiconductor devices 306 are carried and a second fabric laminating layer 308. Self-piercing or fabric displacement contacts 310 have one end surface 312 attached or coupled to the appropriate desired locations on the organic semiconductor device and/or circuit 306 prior to the laminating process. The contacts 310 have sharp points 314 which pierce or displace the laminating fabric layer 308 during the lamination process as the fabric laminating layer is forced into contact with the active fabric layer. Subsequent to the laminating process, contact with the organic semiconductor devices on the active fabric layer 364 is via the piercing contact 314 protruding through the laminating layer 308. Preferably, a cap 318 covers the protruding contact point 314 of the contact 310 if desired. The cap 318 then provides the necessary contact and conductive surface to interface with external components necessary to complete the desired system.

Figure 8:
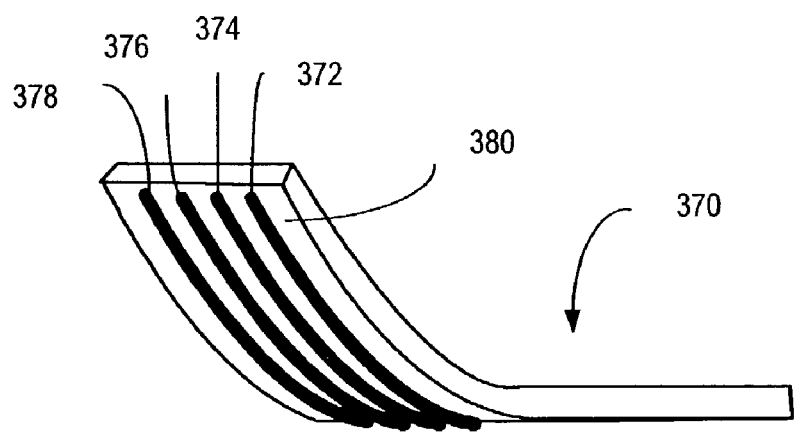
FIG. 8 is a schematic representation of a connecting tape having conductors of organic and/or inorganic material deposited thereon for interconnection with an organic semiconductor substrate in accordance with the present invention.
Figure 9:
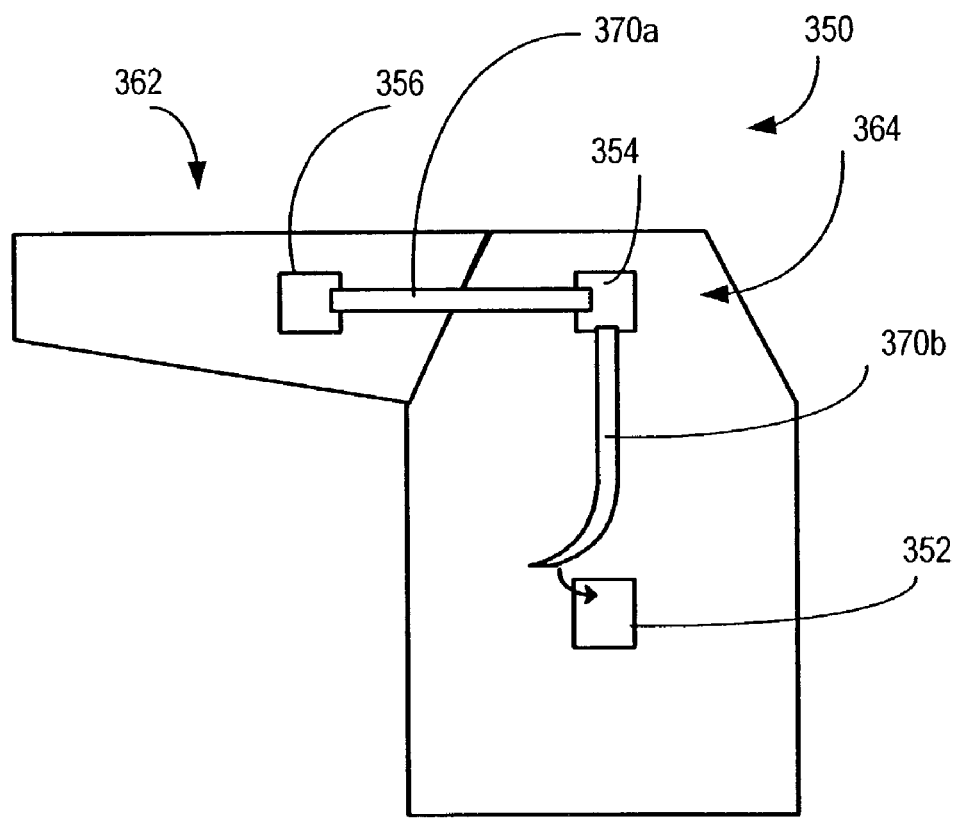
FIG. 9 is a schematic partial plan view of a representative article of clothing having an organic semiconductor substrate integrated into the clothing fabric showing the connecting tape of FIG. 8 interconnecting different substrates.
Figure 10:
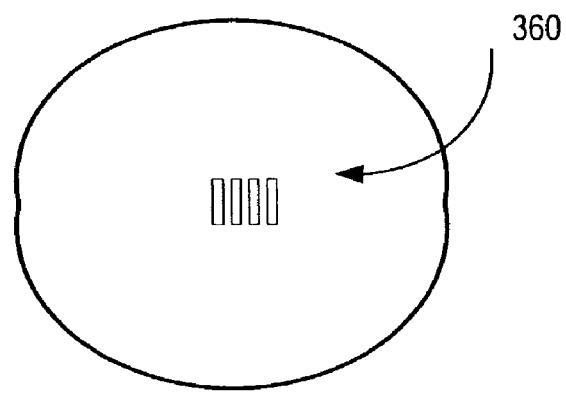
FIG. 10 is a schematic top plan view showing the contact areas of a substrate exposed through the clothing fabric for contact with the connecting tape of FIG. 8.

Turning now to FIGS. 8, 9 and 10, an illustrative embodiment of an organic semiconductor system manufactured in accordance with the present invention is illustrated therein, wherein FIG. 9 is a schematic partial plan view of a representative article of clothing 350 having an organic semiconductor device 352, 354, 356 integrated into the clothing fabric in the illustrated areas. As illustrated in FIG. 10, a schematic top plan view shows the arrangement of the contact areas 360 of an organic semiconductor device and/or system, such as 352, 354, 356, which may be integrated into the fabric of the garment 350 for interconnection to other different organic semiconductor devices/systems in the garment to provide the overall required functionality. One method for interconnecting the various different organic semiconductor devices 352, 354, 356 integrated with the garment fabric is illustrated by the seam tape 370 shown in FIG. 8, wherein the tape 370 has conductors 372, 374, 376, 378 formed by suitable organic or inorganic materials deposited on one surface 380 defining a stripe substantially along the length of the surface of the tape 370. The tape 370 is flexible and has adhesive or other adhering means to contact the surface of the garment fabric to remain in position. The seam tape 370a is located as illustrated in FIG. 9 to interconnect organic semiconductor devices and/or systems, for example, one system 356 is illustrated in the sleeve region 362 and a second system 354 is illustrated in the back shoulder region 364 of a garment 350. A second connecting tape 370b interconnects the organic semiconductor device/system 354 with a further organic semiconductor device/system 352 also located in the back of the garment.

Although the examples disclosed above consider articles of clothing or garments as possible applications, the organic semiconductor systems produced in the reel-to-reel process can be used in other applications, for example the organic semiconductor devices and circuits could be deposited on plastic films or on paper or cardboard or other substrates used in labeling and/or packaging to provide intelligence related to the specific application utilizing these materials. For example, the organic circuit and system may be attached or part of the packaging of an age-dependent product that has a defined time/date expiration to indicate the status of the product. For example, a green or red light may illuminate when a button is pushed to indicate whether the item is within the expiration date or outside the expiration date.

Other applications could relate to providing the scheduling, for example, the time to take a particular medicine, dosage, quantity or history of when the drug was taken by incrementing the circuit deposited within the label, for instance, attached to the medication container.

A further application example could be a chain of custody tracking wherein a specific item includes a label or the label may be on a case containing the item to record data relative to the chain of custody and identification of the item and other pertinent information. The various information is stored and processed by the organic semiconductor circuitry deposited as part of the label.

A method and apparatus for manufacturing of organic semiconductor devices and organic semiconductor systems using reel-to-reel processing has been described above in several preferred embodiments. It will be recognized that although organic semiconductor material has been disclosed above, other materials, including organic metallic paste, different blends and the like, are also usable in the reel-to-reel processes described above, particularly if the materials are part of the applications and/or devices or are used as the devices themselves. Although the reel-to-reel manufacturing process is preferable, the invention contemplates other processing methods such as batch processing. Accordingly, the invention has been described by way of illustration rather than limitation.

The invention claimed:

1. Method, comprising the steps of:
   reel-to-reel manufacturing of organic semiconductor devices further comprising the steps of:
   advancing substrate material from a pay-out roll of a suitable substrate material, said substrate material having a width and a receiving surface, and said roll carrying a length of said substrate material;
   passing said advancing substrate material through an organic semiconductor material application station;
   controlling the deposit of said organic semiconductor material onto the receiving surface across the width of said substrate material as the substrate material passes said application station;
   depositing or not depositing said organic semiconductor material in a desired pattern to produce an intended organic semiconductor device to achieve a desired electrical functionality wherein said desired pattern includes at least one predetermined pattern to define a desired circuit;
   collecting said organic semiconductor device deposited substrate material on a take up mechanism to form a collection roll of said organic semiconductor device substrate material.

2. The method of claim 1, further comprising the step of laminating a fabric material to a first side of the organic semiconductor deposited substrate material.

3. The method of claim 2, further comprising the step of laminating a fabric material to a second side of the organic semiconductor deposited substrate material.

4. The method of claim 2, further comprising the step of laminating the fabric material to the organic semiconductor deposited side of the substrate material.

5. The method of claim 1, further comprising the step of laminating a fabric material to both sides of the organic semiconductor deposited substrate material.

6. The method of claim 1, further comprising the step of providing circuit contact access means.

7. The method of claim 6, further comprising providing at least one aperture in a fabric material covering the deposited organic semiconductor material through which aperture the organic semiconductor circuit is accessed.

8. The method of claim 6, further comprising the step of providing contact means having one side coupled to the organic semiconductor circuit and a material deforming side opposite the one side for penetrating through a fabric material covering the deposited organic semiconductor material to provide the desired circuit contact access.

9. The method of claim 8, further comprising the step of providing a retaining cap means on the contact means to sandwich the fabric material between the retaining cap and one side of the substrate material.

10. The method of claim 9, further comprising the step of sandwiching the fabric material between the retaining cap and the side of the substrate material carrying the organic semiconductor circuit.

11. The method of claim 1, further comprising the step of electrically connecting the at least one predetermined pattern defining the desired circuit to signals including voltage reference potential signals, electrical ground reference potential signals and mixed digital and analog signals.

12. The method of claim 11, further comprising the step of providing a seam tape having at least one electrically conductive stripe on one side of the seam tape for electrically contacting one or more predetermined patterns defining the desired circuit to provide a desired system.

13. The method of claim 12, further comprising the step of integrating the desired circuit into a garment and adhering the seam tape to the surface of the garment and in electrical contact with the desired circuit to provide an electrical conductive path to and from the at least one desired circuit.

14. The method as defined in claim 1 wherein the step of controlling the deposit of organic semiconductor material further includes controlling one or more ink-jet printing heads carried at the application station in a spaced relationship with respect to the substrate material receiving surface.

15. The method as defined in claim 14 wherein the one or more ink-jet printing heads are carried by a gantry at the application station and arranged for movement within the gantry to provide relative X, Y coordinate movement with respect to the receiving surface as said substrate material moves through the application station.

16. The method as defined in claim 1 further including advancing substrate material from a pay-out roll of fabric substrate material.

17. The method as defined in claim 1 further including advancing substrate material from a pay-out roll of a pre-coated protective layer receiving surface substrate material.

18. The method of claim 17, further comprising the step of providing an outer protective layer over the deposited organic semiconductor material.

19. The method as defined in claim 1 further including the step of advancing the substrate material through a protective layer application station prior to passing the substrate material through the organic semiconductor material application station.

20. The method as defined in claim 1 further including carrying out the steps of reel-to-reel manufacturing of organic semiconductor devices in an evaporation chamber wherein the steps of depositing or not depositing said organic semiconductor material in a desired pattern further includes vacuum depositing organic semiconductor material from an evaporation source of organic semiconductor material onto the receiving surface of the substrate material through an evaporation mask located in a spaced relationships to the receiving surface and arranged between the evaporation source and the substrate material.

* * * * *